United States Patent
Breitwisch et al.

(10) Patent No.: US 7,525,176 B2
(45) Date of Patent: Apr. 28, 2009

(54) PHASE CHANGE MEMORY CELL DESIGN WITH ADJUSTED SEAM LOCATION

(75) Inventors: Matthew J. Breitwisch, Yorktown Heights, NY (US); Thomas Happ, Tarrytown, NY (US); Alejandro Gabriel Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 227 days.

(21) Appl. No.: 11/668,992

(22) Filed: Jan. 30, 2007

(65) Prior Publication Data

US 2008/0179591 A1 Jul. 31, 2008

(51) Int. Cl.
*H01L 29/00* (2006.01)
*H01L 21/20* (2006.01)

(52) U.S. Cl. .................. 257/536; 438/382; 365/148
(58) Field of Classification Search ................. 257/529, 257/530, 536, 537, 4; 438/238, 382, 385; 365/148, 163
See application file for complete search history.

(56) References Cited

U.S. PATENT DOCUMENTS

| 6,936,840 B2 | 8/2005 | Sun et al. |
| 7,038,261 B2 | 5/2006 | Horii |
| 2003/0003647 A1 * | 1/2003 | Dennison et al. ............ 438/238 |
| 2006/0024950 A1 | 2/2006 | Choi et al. |
| 2006/0110878 A1 | 5/2006 | Lung et al. |
| 2006/0186483 A1 | 8/2006 | Cho et al. |

FOREIGN PATENT DOCUMENTS

| EP | 1439579 A1 * | 7/2004 |
| WO | WO 9612301 A1 * | 4/1996 |

* cited by examiner

*Primary Examiner*—Lisa M Caputo
*Assistant Examiner*—Jessica Hall
(74) *Attorney, Agent, or Firm*—Ido Tuchman; Ryan, Mason & Lewis, LLP

(57) ABSTRACT

A memory cell comprises a lower electrode, a phase change feature, a spacer feature, and a dielectric layer. The lower electrode comprises a first surface region as well as a second surface region that is raised in relation to the first surface region. The phase change feature is disposed on the second surface region of the lower electrode and has one or more sidewalls. The spacer feature is also disposed on the second surface region of the lower electrode and against the one or more sidewalls of the phase change feature. The dielectric layer is formed at least partially on top of the first surface region of the lower electrode and abutting the spacer feature.

20 Claims, 8 Drawing Sheets

PHASE CHANGE MEMORY CELL DESIGN WITH ADJUSTED SEAM LOCATION

FIELD OF THE INVENTION

This invention relates generally to memory cells in integrated circuits, and, more particularly, to reducing the defects in, and improving the reliability of, memory cells comprising phase change materials.

BACKGROUND OF THE INVENTION

The possibility of using phase change materials (PCMs) in nonvolatile memory cells has recently gained momentum as more is learned about these materials and their integration into integrated circuits. For example, binary and ternary chalcogenide alloys such as antimony telluride and germanium antimony telluride (GST) are showing great promise for use in practical PCM-based memory cells. When incorporated in a memory cell, these materials can be toggled between higher and lower electrical resistance states by applying a pulse of electrical current ("switching current pulse") to the memory cell. Subsequently, after writing to a memory cell in this way, the electrical resistance state of the given memory cell can be determined (i.e., read) by applying a low magnitude sensing voltage to the material in order to determine its electrical resistance state.

A phase change feature in a typical PCM-based memory cell is disposed between two conductive electrodes and is otherwise surrounded by a dielectric material such as silicon dioxide. The two electrodes are operative to cause an applied switching current pulse to flow through the phase change feature. This switching current pulse, in turn, results in ohmic heating in the PCM and induces some or all of the PCM to change phase. The dielectric portion of the memory cell, on the other hand, serves several different purposes within the memory cell. First, it electrically isolates the phase change feature from other nearby electrically-active features. In addition, it thermally insulates the phase change feature when switching phases, thereby reducing the magnitude of the switching current pulse needed to write to the memory cell. Finally, the dielectric portion protects the phase change feature from contamination from other nearby materials and from those processing steps occurring subsequent to forming the feature.

Nevertheless, it has recently been observed that seams and other similar defects in the dielectric portions of PCM-based memory cells may induce defects in the phase change features of these memory cells, causing the memory cells to not function properly or to suffer from poor reliability. Accordingly, there is a need for new PCM-based memory cell designs that reduce the deleterious effects of seams in the dielectric portions of the memory cells.

SUMMARY OF THE INVENTION

Embodiments of the present invention address the above-identified need by providing PCM-based memory cell designs that reduce the deleterious effects of seams found in dielectric portions of the memory cells.

In accordance with an aspect of the invention, a memory cell comprises a lower electrode, a phase change feature, a spacer feature, and a dielectric layer. The lower electrode comprises a first surface region as well as a second surface region that is raised in relation to the first surface region. The phase change feature is disposed on the second surface region of the lower electrode and has one or more sidewalls. The spacer feature is also disposed on the second surface region of the lower electrode and against the one or more sidewalls of the phase change feature. The dielectric layer is formed at least partially on top of the first surface region of the lower electrode and abutting the spacer feature.

In one of the above-identified embodiments of the invention, a memory cell comprises a lower electrode with a raised region. A phase change feature and an upper electrode, both combining to form a pillar, are disposed on this raised region. The phase change feature and the upper electrode are both laterally surrounded by a spacer feature. A lower dielectric layer surrounds lateral portions of the lower electrode. An upper dielectric layer surrounds lateral portions of the spacer feature.

Advantageous, any seams found in the upper dielectric layer near the phase change feature in the above-described memory cell embodiment do not intersect the phase change feature but rather intersect the lower electrode. In this way, the deleterious effects of such seams on the memory cell's functionality and reliability are mitigated.

These and other features and advantages of the present invention will become apparent from the following detailed description which is to be read in conjunction with the accompanying figures.

DETAILED DESCRIPTION OF THE INVENTION

This invention will be illustrated herein in conjunction with exemplary memory cells for use in integrated circuits and methods for forming such memory cells. It should be understood, however, that the invention is not limited to the particular materials, features and processing steps shown and described herein. Modifications to the illustrative embodiments will become apparent to those skilled in the art in light of the following description.

Particularly with respect to processing steps, it is emphasized that the descriptions provided herein are not intended to encompass all of the processing steps which may be required to successfully form a functional integrated circuit device. Rather, certain processing steps which are conventionally used in forming integrated circuit devices, such as, for example, wet cleaning and annealing steps, are purposefully not described herein for economy of description. However one skilled in the art will readily recognize those processing steps omitted from these generalized descriptions. Moreover, details of the processing steps used to fabricate such integrated circuit devices may be found in a number of publications, for example, S. Wolf and R. N. Tauber, *Silicon Processing for the VLSI Era, Volume* 1, Lattice Press, 1986, and S. M. Sze, *VLSI Technology, Second Edition,* McGraw-Hill, 1988, both of which are incorporated herein by reference.

The term phase change material (PCM) as used herein is intended to encompass any material displaying more than one programmable electrical resistance state for use in integrated circuits. PCMs comprise, for example, various chalcogenides and transition metal oxides and include, but are not limited to, doped or undoped GeSb, SbTe, $Ge_2Sb_2Te_5$ (GST), $SrTiO_3$, $BaTiO_3$, $(Sr,Ba)TiO_3$, $SrZrO_3$, $Ca_2Nb_2O_7$, $(Pr,Ca)MnO_3$, $Ta_2O_5$, $NiO_x$, and $TiO_x$, as well as other materials.

It should also be understood that the various layers and/or regions shown in the accompanying figures are not drawn to scale, and that one or more layers and/or regions of a type commonly used in integrated circuits may not be explicitly shown in a given figure for economy of description. For example, those integrated circuit features associated with what is commonly referred to as the front-end-of-line and middle-of-line are not described herein. This does not imply that the layers and/or regions not explicitly shown are omitted from the actual integrated circuit.

Figure 1:
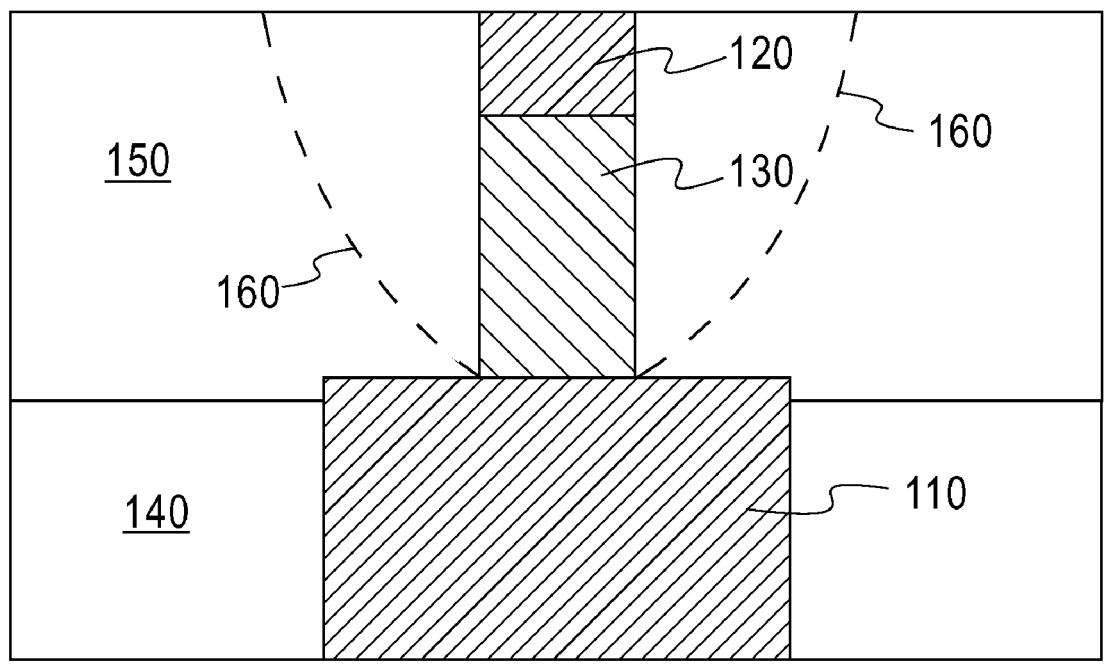
FIG. 1 shows a sectional view of a PCM-based memory cell that can be improved by implementing aspects of the invention.

FIG. 1 shows a particular memory cell design 100 that can be improved by implementing aspects of this invention. The memory cell comprises a lower electrode 110 and an upper electrode 120. A phase change feature 130 lies between these electrodes. A lower dielectric layer 140 surrounds lateral portions of the lower electrode. An upper dielectric layer 150 surrounds lateral portions of the phase change feature and the upper electrode.

The phase change feature 130 comprises a phase change material such as GST, and, in the particular memory cell 100 shown in FIG. 1, is configured in the shape of a round pillar. Storing data in the memory cell is accomplished by placing some portion of the total volume of the PCM (the "switchable volume") into either a lower electrical resistance polycrystalline state or a higher electrical resistance amorphous state. Transitions between these states are accomplished by heating the switchable volume of the PCM by applying a pulse of switching current to the phase change feature through the lower and upper electrodes 110, 120. In a random access memory comprising wordlines and bitlines, the lower electrode may be attached to a wordline while the upper electrode is attached to a bitline. The duration of the switching current pulse may be between about one and 500 nanoseconds and have a fast falling edge (e.g., less than about ten nanoseconds). The fast falling edge acts to freeze the switchable volume of the PCM in its current electrical resistance state without allowing additional time for the bonds within the material to continue to rearrange.

Subsequently, reading the state of the memory cell 100 is accomplished by applying a sensing voltage to the memory cell, again via the lower and upper electrodes 110, 120. The ratio of electrical resistance between the higher and lower electrical resistance states in a typical PCM like GST is between about 100:1 and 1,000:1. The sensing voltage is of low enough magnitude to provide negligible ohmic heating (i.e., Joule heating) in the phase change feature 130. Accordingly, the electrical resistance state of the phase change feature can be determined in this manner without disturbing its written electrical resistance state. Data integrity is thereby maintained while reading the data.

Unfortunately, memory cells configured in a manner similar to the memory cell 100 have recently been observed to suffer from failures and reliability issues associated with seams and other such defects in the upper dielectric layer 150. A seam 160 in the memory cell 100 is shown on FIG. 1 as dashed lines. When examined in actual devices using scanning electron microscopy, such a seam appears as a narrow crevice or void in the upper dielectric layer that surrounds the phase change feature 130. It originates at approximately the base of the phase change feature and propagates upward through the upper dielectric layer.

Figure 2A:
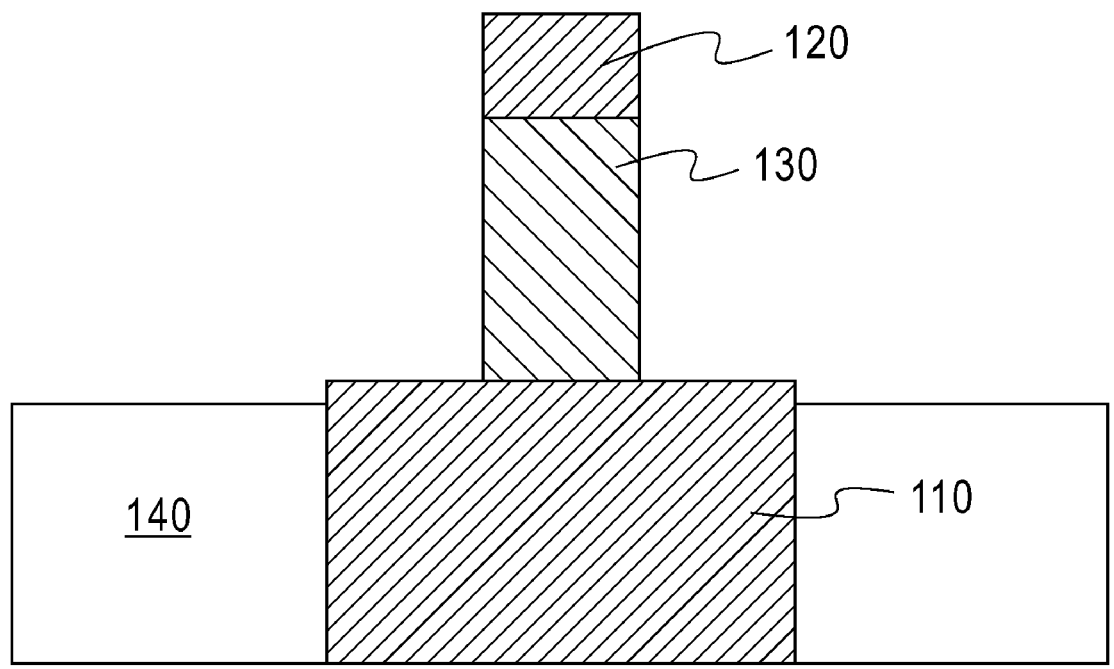
FIGS. 2A and 2B show sectional views of the FIG. 1 memory cell during various stages of its formation.
Figure 2B:
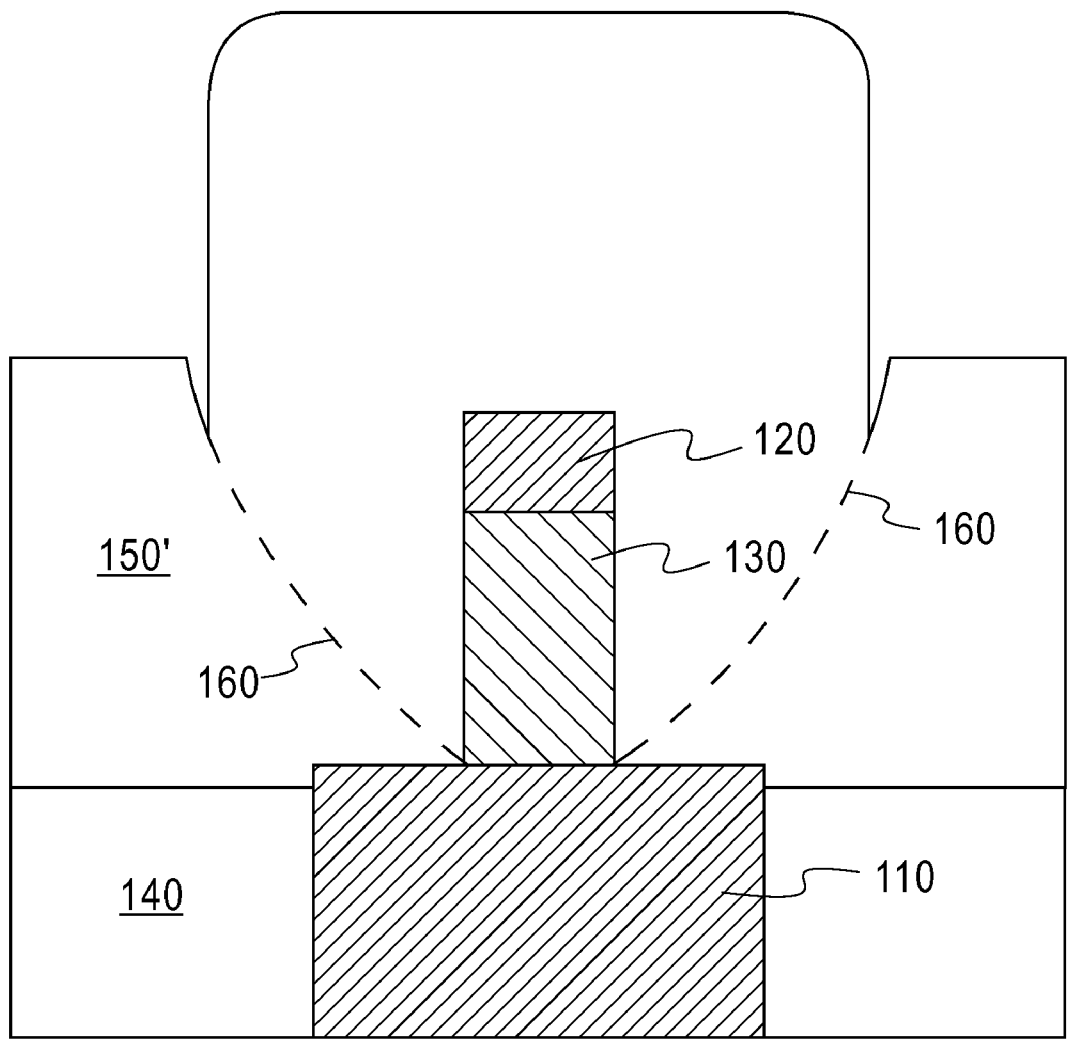

The origin of the seam 160 can be explained by looking at the formation of the upper dielectric layer 150 when fabricating the memory cell 100. FIGS. 2A and 2B show sectional views of the memory cell during two stages in its formation. In FIG. 2A, the lower electrode 110, the lower dielectric layer 140, the phase change feature 130, and the upper electrode 120 have been formed using conventional semiconductor processing steps that will be further detailed below. In FIG. 2B, a layer of dielectric material for the upper dielectric layer 150, labeled by reference numeral 150', has been blanket deposited on the film stack shown in FIG. 2A. The seam is formed in this blanket deposition process.

The seam 160 forms in the upper dielectric layer deposition process because of the dynamics of film growth during this process. When deposited by chemical vapor deposition (CVD), the material forming the upper dielectric layer 150 tends to deposit at various rates on each of the exposed surfaces subjected to the deposition process. The combination of deposition on the exposed surfaces of the film stack shown in FIG. 2A tends to cause the characteristic seam to form where dielectric films originating at the different surfaces meet. Once the layer of dielectric material is polished using chemical-mechanical polishing (CMP), the memory cell appears identical to the memory cell 100 shown in FIG. 1. The seam remains in the upper dielectric layer.

It is noted that several attempts have been made to eliminate the seam 160 using different dielectric deposition methodologies for the upper dielectric layer 150. For example, several different silicon dioxide deposition techniques have been tried. However, even silicon dioxide deposition using high density plasma CVD (often referred to as HDCVD or HDP-CVD) has not been shown to resolve the seam issue satisfactorily. As one skilled in the art will recognize, in conventional high density plasma CVD of silicon dioxide, high radio frequency bias powers are applied to a combination of silane, oxygen, and argon. The high bias powers cause the argon to sputter the deposited material while it is deposited. Such a process typically produces better gap fill properties and higher density films than other CVD techniques.

The seam 160 in the memory cell 100 may adversely affect memory cell performance and reliability. The seam may, for example, provide a pathway for contaminants to travel to the phase change feature 130. These contaminants may come from other nearby features in the integrated circuit or may originate in those processing steps occurring after the layer of dielectric material 150' is deposited. For example, contaminants may come from the slurry in the CMP step used to planarize this layer. In addition, or alternatively, the seam may act to translate physical stresses to the phase change feature during subsequent processing. For example, the CMP step used to planarize the layer of dielectric material 150' may produce significant physical stresses on the raised portion of this layer during the planarization process. Because of the seam, this physical stress may be translated to the base of the phase change feature itself, producing cracks or voids in this feature. Any one of these mechanisms can cause the memory cell to not function or to suffer from poor reliability.

Figure 3:
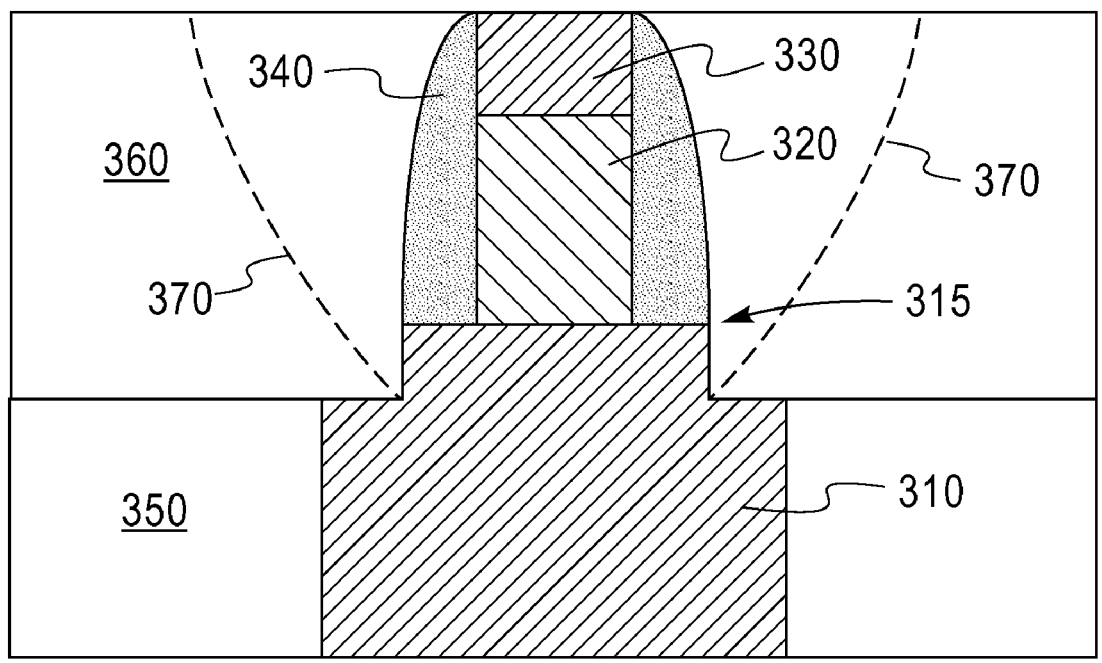
FIG. 3 shows a sectional view of a PCM-based memory cell in accordance with an illustrative embodiment of the invention.

Fortunately, aspects of this invention help to mitigate the issues with seams described above. FIG. 3 shows sectional view of a memory cell 300 in accordance with an illustrative embodiment of the invention. The memory cell comprises a lower electrode 310 with a raised region 315. A phase change feature 320 and an upper electrode 330, both combining to form a pillar, are disposed on this raised region. The phase change feature and the upper electrode are both laterally surrounded by a spacer feature 340. A lower dielectric layer 350 surrounds lateral portions of the lower electrode. An upper dielectric layer 360 surrounds lateral portions of the spacer feature.

In the memory cell 300, the phase change feature 320 preferably comprises GST, but any other suitable PCM may be utilized. In contrast, the lower electrode 310 and the upper electrode 330 preferably comprise titanium nitride or tantalum nitride, but may also comprise other suitable conductive materials such as, but not limited to, tungsten, titanium silicon nitride, tantalum silicon nitride, titanium aluminum nitride, tantalum aluminum nitride, and carbon. The lower and the upper dielectric layers 350, 360 preferably comprise silicon dioxide, although, again, any suitable dielectric material may be chosen. Finally, the spacer feature 340 preferably comprises silicon nitride, although silicon dioxide and other dielectric materials may be utilized. While the phase change feature and the upper electrode are shown as being pillar shaped, this shape is merely illustrative and other shapes will come within the scope of the invention. When considering the phase change feature and the upper electrode from the top, these features may, for example, describe a square, rectangle, hexagon, or any other discrete shape. Alternatively, these features may be in the form of a straight or curved line.

Advantageously, the memory cell 300 functions in a manner similar to the memory cell 100 shown in FIG. 1. To write to the memory cell 300, the lower and upper electrodes 310, 330 are utilized to pass a switching current pulse through the phase change feature 320 and to cause some portion of the phase change feature to change phase and electrical resistance state. Subsequently, the memory cell may be read by applying a low magnitude sensing voltage to the memory cell in order to determine the resistance state of the switchable volume of the phase change feature.

Like the memory cell 100, the memory cell 300 also comprises a seam, labeled by reference numeral 370. However, unlike the seam 160 in the memory cell 100, the seam 370 does not intersect the base of the phase change feature 320. Instead, the seam intersects the lower electrode 310 near where the electrode steps to the raised region 315. This placement of the seam provides several advantages. Contaminants are not allowed to travel through the seam directly into the phase change feature. Moreover, physical stresses are not transferred directly into the phase change feature during subsequent processing.

Figure 4:
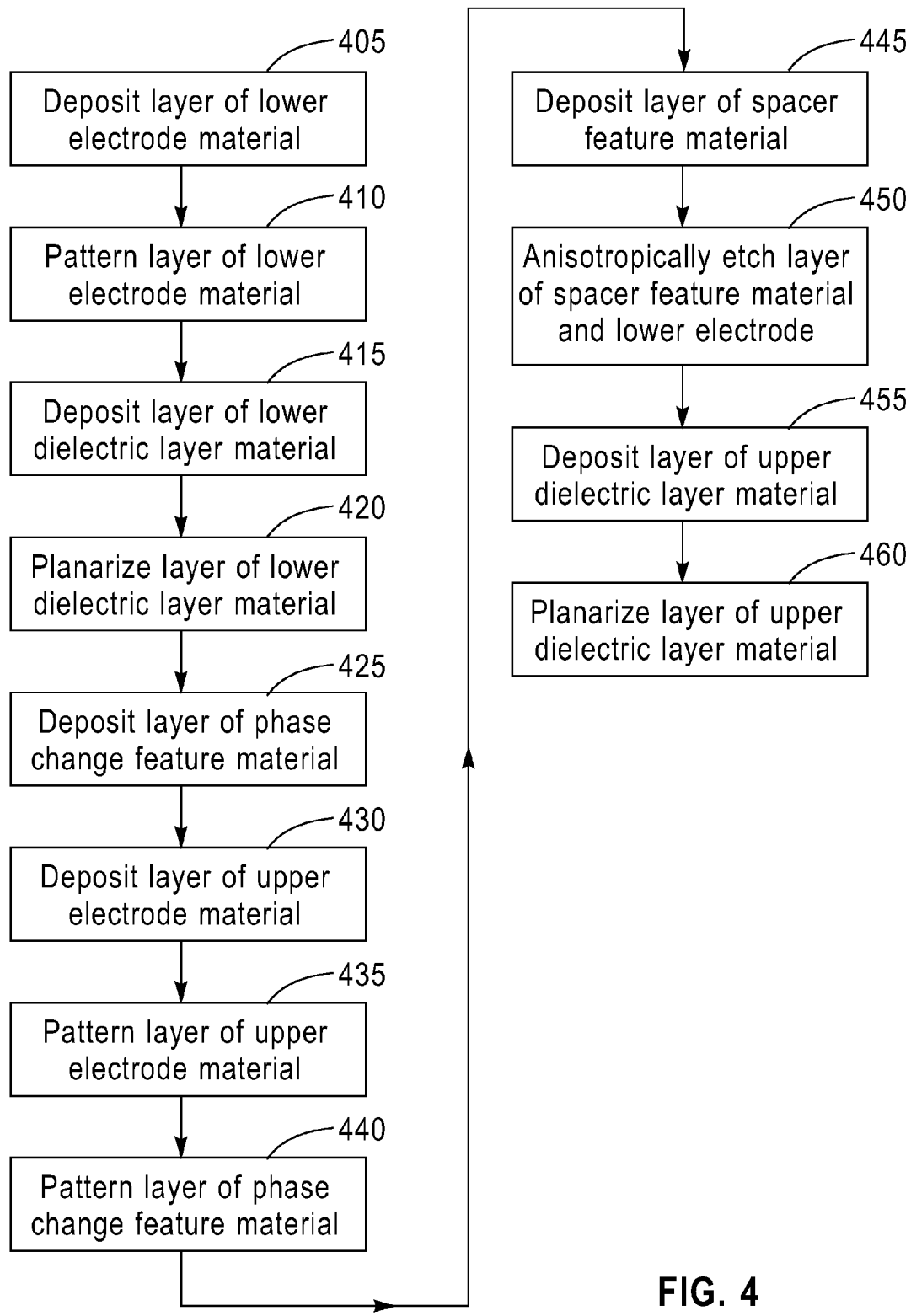
FIG. 4 shows a flow diagram of an illustrative method for forming the FIG. 3 memory cell.
Figure 5A:
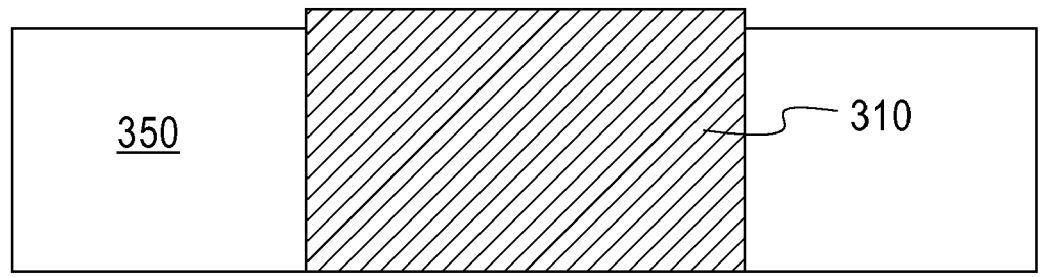
FIGS. 5A-5E show sectional views of the FIG. 3 memory cell during various stages of its formation.

The memory cell 300 can be formed using a novel sequence of what are largely conventional semiconductor processing steps. FIG. 4 shows a flow diagram of an illustrative method for forming the memory cell, while FIGS. 5A-5E show sectional views of the memory cell during various stages of formation. In step 405, a layer of conductive material for the lower electrode 310 (e.g., titanium nitride or tantalum nitride) is deposited on the structure that underlies the memory cell, preferably by conventional CVD. This layer of conductive material is then patterned using conventional photolithography and reactive ion etching (RIE) in step 410 to form the lower electrode. Subsequently, in step 415, a layer of dielectric material for the lower dielectric layer 350 (e.g., silicon dioxide) is deposited on the lower electrode. Deposition is again preferably by conventional CVD. Conventional CMP is then used in step 420 to planarize this layer of dielectric material down to the lower electrode, resulting in the formation of the film stack shown FIG. 5A. It is noted that the lower electrode may protrude slightly above the topmost surface of the lower dielectric layer, as shown in FIG. 5A, due to CMP dishing and due to wet cleaning steps not specifically enumerated herein that tend to etch silicon dioxide at a faster rate than they do metallic materials.

Figure 5B:
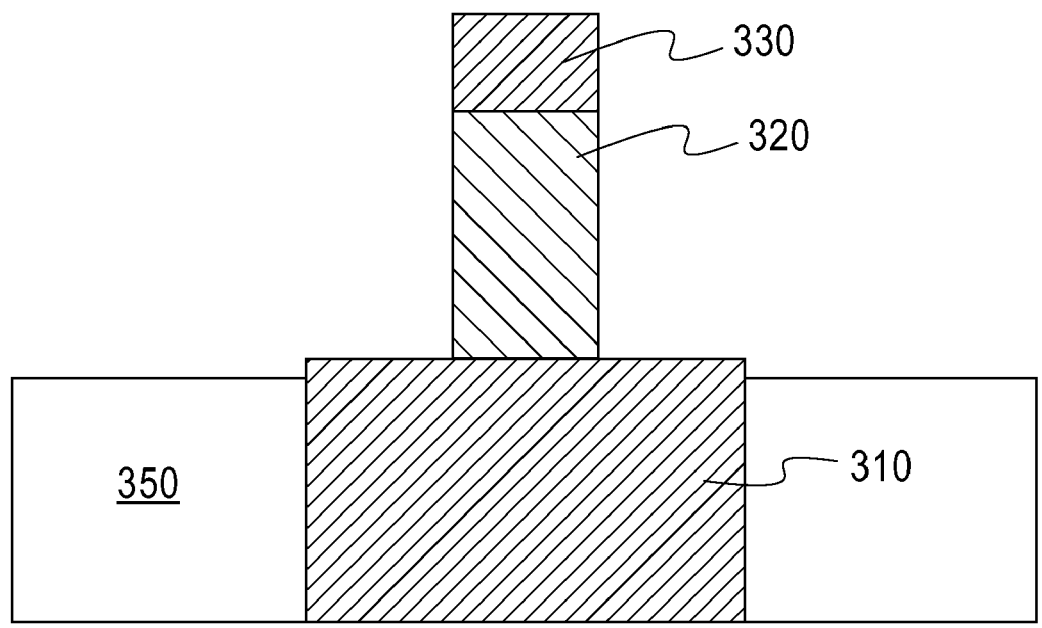

In step 425 of the illustrative process sequence, a layer of phase change material for the phase change feature 320 (e.g., GST) is blanket deposited on the lower electrode 310 and the lower dielectric layer 350. GST deposition is preferably performed using conventional sputter deposition, although any other suitable deposition method may also be utilized. In step 430, a layer of conductive material for the upper electrode 330 (e.g., titanium nitride or tantalum nitride) is deposited on the layer of phase change material. Next, in step 435, the layer of conductive material is patterned by conventional photolithography and RIE to form the upper electrode in the desired shape, in this case, a pillar. After stripping the photoresist, the upper electrode is then subsequently utilized as a hard mask to pattern the layer of phase change material using conventional RIE in step 440 to form the phase change feature. The resultant film stack is shown in FIG. 5B.

Figure 5C:
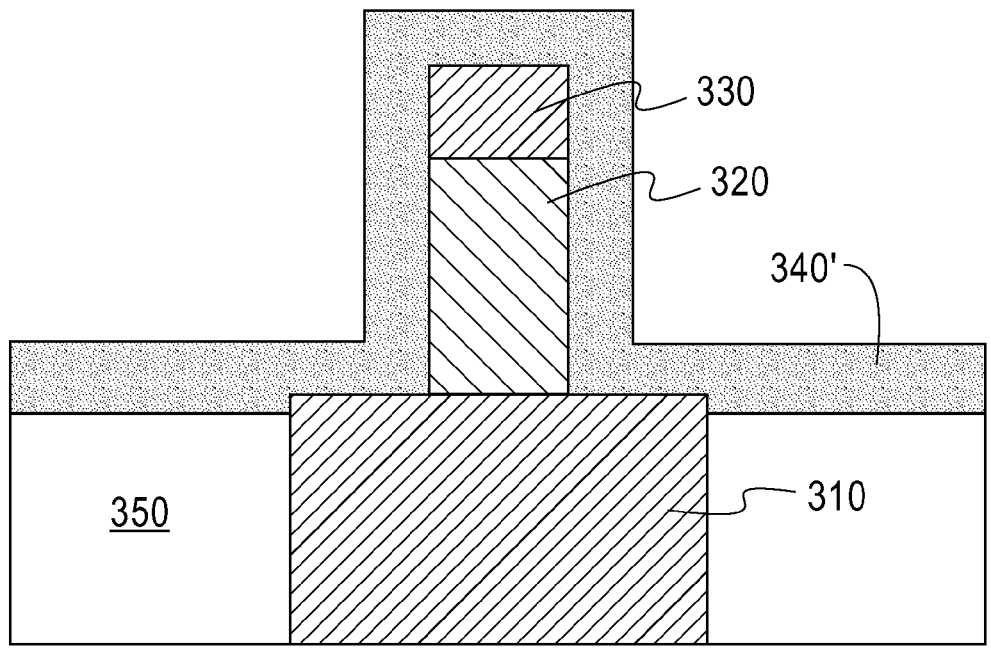

Following these steps, a layer of spacer material for the spacer feature 340 (e.g., silicon nitride), labeled by reference numeral 340', is deposited in step 445 on the exposed surfaces of the phase change feature 320, the upper electrode 330, the lower electrode 310, and the lower dielectric layer 350, resulting in the film stack shown in FIG. 5C. The layer of spacer material is preferably deposited by conventional CVD. The film stack is then anisotropically etched in step 450. This anisotropic etching step is preferably performed by a RIE process comprising two sub-steps. The first sub-step of the RIE process removes the layer of spacer material from the horizontal surfaces of the upper electrode, the lower electrode, and the lower dielectric layer. This step leaves spacer material only along the sidewall of the phase change feature and the upper electrode, forming the spacer feature. The second step of the RIE process continues etching into the lower electrode and the lower dielectric layer using the upper electrode and the spacer feature as a hard mask. This step acts to form the raised region 315 of the lower electrode.

Figure 5D:
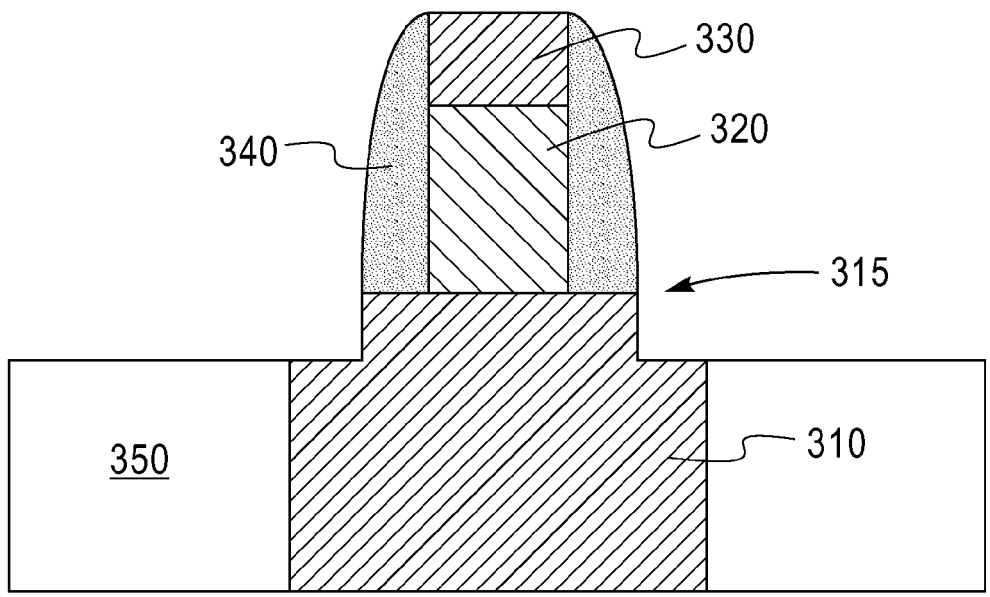

One skilled in the art will recognize that sidewall spacer features like the spacer feature 340 shown in FIG. 5D are used extensively in semiconductor processing applications different from that described herein. For example, silicon nitride sidewall spacer features are frequently used in association with the gate conductors in metal-oxide-semiconductor field effect transistors (MOSFETs) to both protect the sidewalls of the gate conductors and to act as self-aligned masks during ion implantation steps. The first RIE sub-step can be accomplished, for example, using reactants such as trifluoromethane ($CHF_3$) and oxygen.

The second sub-step of the RIE process of step 450 continues etching into the lower electrode and the lower dielectric layer. The second RIE sub-step may be accomplished, for example, using the same reactants as the first RIE sub-step, or, alternatively may utilize reactants that more readily etch metallic materials such as chlorine-based reactants. Depending on the tooling available, this second RIE sub-step may be performed in the same RIE tool as the first RIE sub-step, or may be performed in a different RIE tool.

Figure 5E:
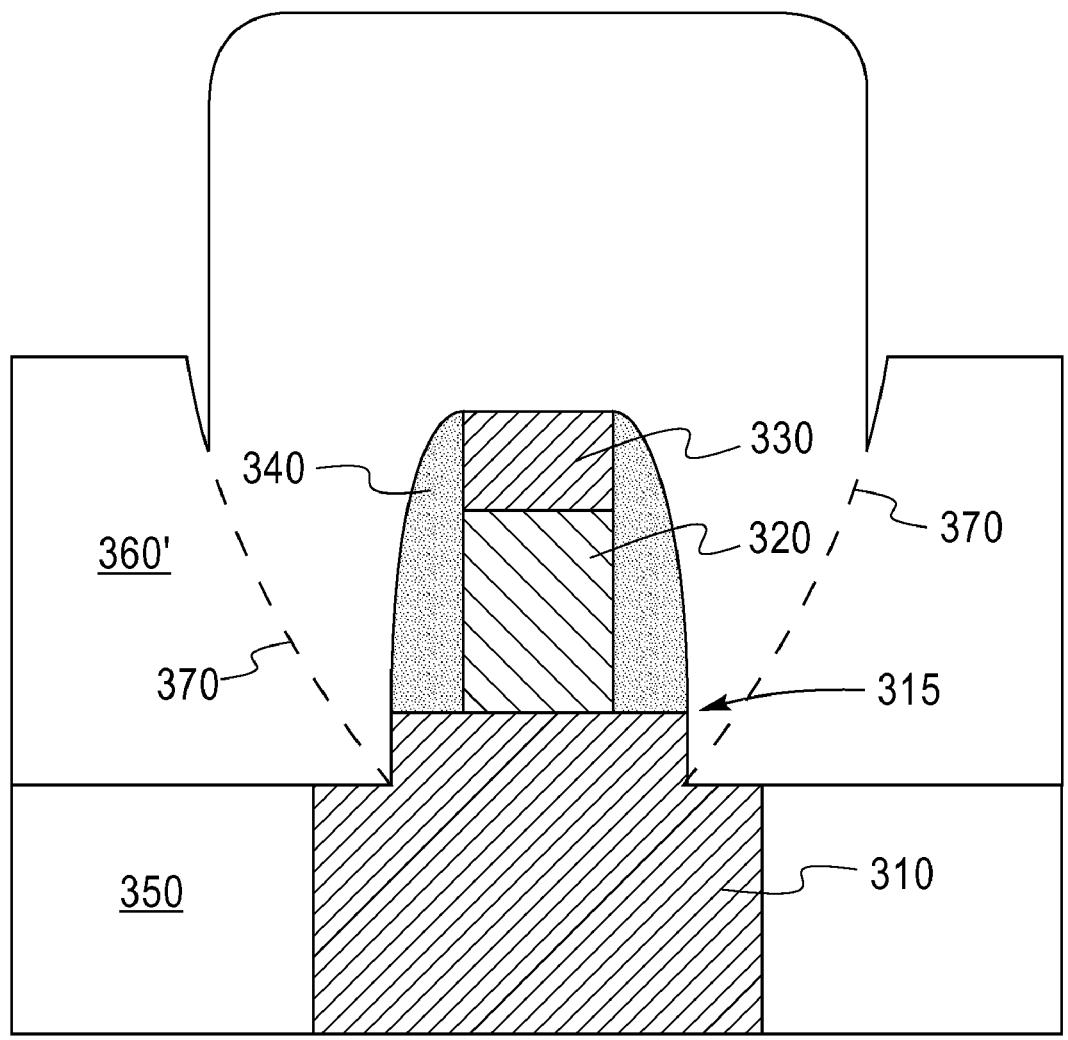

Subsequently, in step 455 in FIG. 4, a layer of dielectric material for the upper dielectric layer 360 (e.g., silicon dioxide), labeled by reference numeral 360', is deposited on the film stack, resulting in the film stack shown in FIG. 5E. This deposition is preferably again by CVD. While the seam 370 will typically form during this deposition process, this seam intersects the lower electrode 310 rather than the base of the phase change feature 320 as described above with reference to FIG. 3. The deleterious effects of the seam on the memory cell 300 are thereby mitigated.

Conventional CMP is then used to planarize the layer of dielectric material 360' in step 460 to form the upper dielectric layer 360. After this step, the resultant film stack appears identical to the memory cell 300 shown in FIG. 3.

It is again emphasized that the process sequence described in FIGS. 4 and 5A-5E is illustrative and many other processes may be used without departing from the scope of the invention. As just one example, it may be preferable to form the lower electrode 310 using damascene-type processing rather than patterning the electrode directly with photolithography and RIE in the manner described above. Damascene-type processing of conductive features will be familiar to one skilled in the art. In a damascene-type process, the dielectric layer in which the electrode sits is first deposited and patterned such that the dielectric layer comprises a hole in the shape of the desired electrode. Electrode material is then conformally deposited onto the patterned dielectric layer so that it completely fills the hole. Excess electrode material is subsequently removed from the top of the dielectric layer by conventional CMP, leaving discrete electrode features in the dielectric layer.

What is more, it is not necessary that the upper electrode 330 be used as a hard mask when forming the phase change feature 320 in the manner described above. Instead, the phase change feature and the upper electrode may be formed using independent processing steps. That is, a layer of phase change material for the phase change feature may be deposited and patterned using conventional photolithography and RIE. In subsequent processing, a layer of conductive material for the upper electrode may be deposited and patterned to form the upper electrode using separate photolithography and RIE steps.

The PCM-based memory cell 300 described above is part of the design for an integrated circuit chip. The chip design may be created in a graphical computer programming language, and stored in a computer storage medium (such as a disk, tape, physical hard drive or virtual hard drive such as in a storage access network). If the designer does not fabricate chips or photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are formed on a wafer. The photolithographic masks are utilized to define areas of the wafer (and/or the layers thereon) to be etched or otherwise processed.

The resulting integrated circuit chips may be distributed by the fabricator in raw wafer form (i.e., as a single wafer that has multiple unpackaged chips), as a bare die, or in packaged form. In the latter case, the chip is mounted in a single chip package (e.g., plastic carrier with leads that are affixed to a motherboard or other higher level carrier) or in a multichip package (e.g., ceramic carrier that has either or both surface interconnections or buried interconnections). In any case, the chip is then integrated with other chips, discrete circuit elements, and/or other signal processing devices as part of either an intermediate product (e.g., motherboard) or an end product. The end product may be any product that includes integrated circuit chips, ranging from toys and other low-end applications to advanced computer products having a display, a keyboard or other input device, and a central processor.

Although illustrative embodiment of the present invention has been described herein with reference to the accompanying figures, it is to be understood that the invention is not limited to those precise embodiments. For example, the materials utilized in the illustrative embodiments and the particular processing steps used to fabricate the illustrative embodiments may be changed without departing from the scope of the appended claims. These changes and various other modifications will be evident to one skilled in the art.

What is claimed is:

1. A memory cell comprising:
    a lower electrode, the lower electrode comprising a first surface region and a second surface region, the second surface region raised in relation to first surface region;
    a phase change feature, the phase change feature disposed on the second surface region of the lower electrode and comprising a phase change material and one or more sidewalls;
    a spacer feature, the spacer feature disposed on the second surface region of the lower electrode and against the one or more sidewalls of the phase change feature; and
    a dielectric layer, the dielectric layer disposed at least partially on the first surface region of the lower electrode and abutting the spacer feature.

2. The memory cell of claim 1, wherein the phase change feature and the spacer feature occupy substantially the whole of the second surface region of the lower electrode.

3. The memory cell of claim 1, wherein the lower electrode comprises titanium nitride, tantalum nitride, tungsten, titanium silicon nitride, tantalum silicon nitride, titanium aluminum nitride, tantalum aluminum nitride, or carbon, or a combination thereof.

4. The memory cell of claim 1, wherein the phase change feature comprises germanium, antimony, sulfur, selenium, or tellurium, or a combination thereof.

5. The memory cell of claim 1, wherein the phase change feature comprises a transition metal oxide.

6. The memory cell of claim 1, wherein the spacer feature comprises silicon dioxide or silicon nitride.

7. The memory cell of claim 1, wherein the dielectric layer comprises silicon dioxide or silicon nitride.

8. The memory cell of claim 1, further comprising an upper electrode, the upper electrode disposed on the phase change feature.

9. The memory cell of claim 8, wherein the lower and upper electrodes are adapted to pass an electrical signal through the phase change feature in order to cause at least a portion of the phase change feature to change phase.

10. The memory cell of claim 1, wherein the dielectric layer comprises a seam.

11. A method of forming a memory cell, the method comprising the steps of:
    forming a lower electrode, the lower electrode comprising a first surface region and a second surface region, the second surface region raised in relation to first surface region;
    forming a phase change feature, the phase change feature disposed on the second surface region of the lower electrode and comprising a phase change material and one or more sidewalls;
    forming a spacer feature, the spacer feature disposed on the second surface region of the lower electrode and against the one or more sidewalls of the phase change feature; and
    forming a dielectric layer, the dielectric layer disposed at least partially on the first surface region of the lower electrode and abutting the spacer feature.

12. The method of claim 11, wherein the step of forming a spacer feature comprises depositing a layer of spacer material and anisotropically etching the layer of spacer material.

13. The method of claim 12, wherein anisotropically etching comprises reactive ion etching.

14. The method of claim 11, wherein the step of forming the lower electrode comprises defining the first and second surface regions of the lower electrode by anisotropic etching.

15. The method of claim 14, wherein the spacer feature and the phase change feature are used as a mask while defining the first and second surface regions of the lower electrode by anisotropic etching.

16. The method of claim 11, wherein the step of forming the dielectric layer comprises chemical vapor deposition.

17. The method of claim 11, wherein the step of forming the dielectric layer comprises chemical-mechanical polishing.

18. An integrated circuit comprising one or more memory cells, at least one of the one or more memory cells comprising:

a lower electrode, the lower electrode comprising a first surface region and a second surface region, the second surface region raised in relation to first surface region;

a phase change feature, the phase change feature disposed on the second surface region of the lower electrode and comprising a phase change material and one or more sidewalls;

a spacer feature, the spacer feature disposed on the second surface region of the lower electrode and against the one or more sidewalls of the phase change feature; and a dielectric layer, the dielectric layer disposed at least partially on the first surface region of the lower electrode and abutting the spacer feature.

19. The integrated circuit of claim 18, wherein the integrated circuit comprises a random access memory.

20. The integrated circuit of claim 18, wherein the integrated circuit comprises a nonvolatile memory.

* * * * *